United States Patent [19]
Eaton, Jr.

[11] 3,725,822
[45] Apr. 3, 1973

[54] PHASE SHIFT OSCILLATORS USING INSULATED-GATE FIELD-EFFECT TRANSISTORS

[75] Inventor: Sargent Sheffield Eaton, Jr., Phillipsburg, N.J.

[73] Assignee: RCA Corporation, Somerville, N.J.

[22] Filed: May 20, 1971

[21] Appl. No.: 145,407

[52] U.S. Cl..........331/108 B, 331/108 A, 331/116 R, 331/135, 331/175

[51] Int. Cl.............................H03b 5/24, H03b 5/36

[58] Field of Search...331/108 R, 108 A, 108 B, 109, 331/116 R, 116 M, 117 R, 135, 159, 175, 176; 307/304; 330/35

[56] References Cited

UNITED STATES PATENTS 3,568,091 3/1971 Rahe............................331/116 R X
3,585,527 6/1971 Luscher, II..................331/116 R

OTHER PUBLICATIONS

Wanlass, "Novel Field-Effect Device Provides Broadband Gain" Electronics, Nov. 1, 1963, pp. 30-33
Clifton, "Mosfet's", Radio-Electronics, pp. 61-63, 68, Dec. 1969.

*Primary Examiner*—Roy Lake
*Assistant Examiner*—Siegfried H. Grimm
*Attorney*—H. Christoffersen

[57] ABSTRACT

An oscillator comprising a complementary symmetry field effect transistor inverter, and a feedback loop from the output terminal to the input terminal of the inverter. Frequency stabilization is achieved by connecting the source electrode of each transistor through a resistor to the respective power supply terminals for these transistors and the two substrates directly to the respective power supply terminals.

7 Claims, 3 Drawing Figures

INVENTOR.
SARGENT S. EATON
BY
Henry Schanzer
ATTORNEY

PHASE SHIFT OSCILLATORS USING INSULATED-GATE FIELD-EFFECT TRANSISTORS

BACKGROUND OF THE INVENTION

Oscillator circuits normally include an amplifying section and feedback network. For oscillation to occur two criteria known as the Barkhausen criteria have to be met. These are: (1) that the gain ($\alpha$) of the amplifying section multiplied by the attenuation ratio ($\beta$) of the feedback network be equal to or greater than 1 ($\alpha\beta \geq 1$); and (2) that the phase shift around the loop be equal to $n \cdot 360°$, where $n$ is an integer equal to or greater than 1. Normally, the amplifying section is designed to have a phase shift of approximately 180°, or an odd multiple thereof, and the feedback network in turn has a phase shift of 180° to provide the required 360° phase shift.

A problem present in most amplifying sections is that due to temperature variations and/or supply voltage variation the output impedance of the amplifying section changes causing a phase shift. Changes in the phase shift result in a change in the frequency of oscillation which, in some applications, may not be tolerable.

SUMMARY OF THE INVENTION

An oscillator comprising an amplifying section having an input node and an output node and a feedback network connected between said nodes. The amplifying section includes an insulated-gate field-effect transistor having a substrate with source and drain electrodes defining a conduction channel in said substrate and a gate electrode for controlling the conductivity of the channel. The gate is connected to said input node and the drain is connected to said output node. In one embodiment of the invention in order to increase the frequency stability, the output impedance of the amplifying section is rendered more constant by returning the source through an impedance element to a power terminal to which the substrate is directly connected.

DETAILED DESCRIPTION OF THE INVENTION

Figure 1:
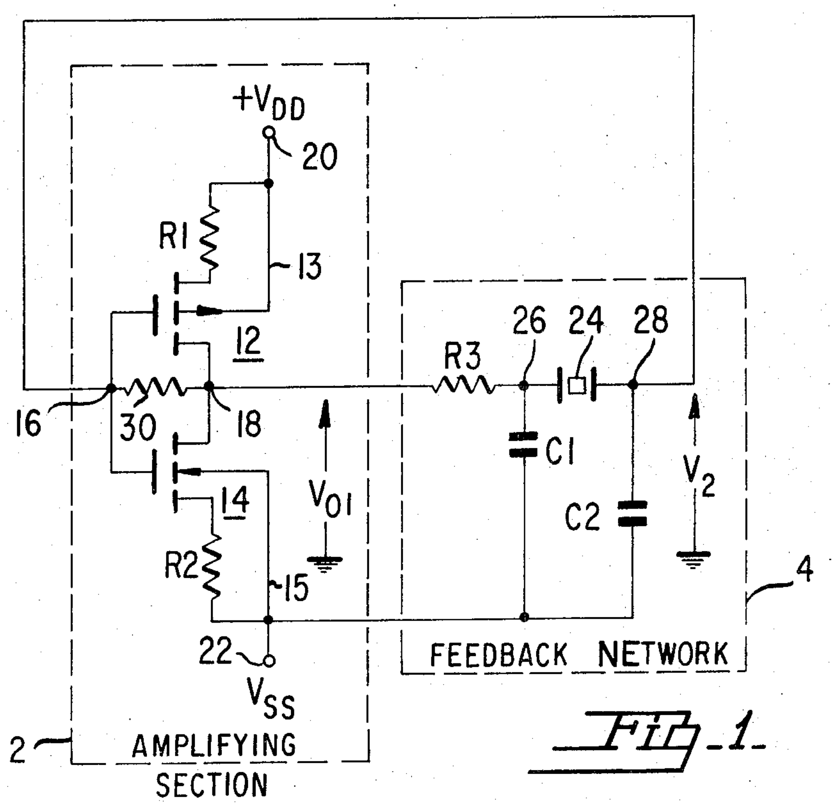
FIG. 1 is a schematic diagram of an oscillator circuit embodying the invention.

FIG. 1 shows an oscillator circuit which includes an amplifying section 2 and a feedback network 4. The amplifying section 2 includes a complementary inverter comprising P-type transistor 12 and N-type transistor 14 whose gates are connected to the amplifier's input node 16 and whose drains are connected to the amplifier's output node 18. The substrate 13 (indicated conventionally by the lead with the arrowhead) of transistor 12 is connected to terminal 20 and the source of transistor 12 is returned through resistor $R_1$ to terminal 20. A potential of $+V_{DD}$ volts may be applied to terminal 20. The substrate 15 of transistor 14 is connected to terminal 22 and the source of transistor 14 is returned through resistor R2 to terminal 22. A negative potential, $V_{SS}$, which in this example is ground potential, may be applied to terminal 22.

A feedback resistor 30 is connected between nodes 16 and 18 of the inverter to establish the direct current (D.C.) bias level of the inverter. Resistor 30 should be large enough (normally greater than 10 meghoms) so as not to appreciably affect the attenuation and phase of the feedback network 4. Resistor 30 sets the D.C. level so that the voltage at node 18 is substantially equal to the voltage at node 16. This point is typically at or near one-half the supply voltage $(V_{DD} - V_{SS})/2$ and is located in the high gain region of the inverter transfer characteristic. For example, when $V_{DD}$ is equal to +10 volts and $V_{SS}$ is ground, the D.C. level at nodes 16 and 18 is approximately equal to 5 volts.

A feedback network, 4, which determines the frequency of oscillation, is connected at its input terminal to node 18 and at its output terminal to node 16. The network, 4, includes a resistor $R_3$ connected between nodes 18 and 26, a capacitor $C_1$ connected between nodes 26 and terminal 22, a quartz crystal 24 connected between nodes 26 and 28, and a capacitor $C_2$ connected between node 28 and terminal 22. Node 28 which may be an output terminal of the network, is connected back to the input terminal (node 16) of the amplifying section.

As already mentioned, for sustained oscillation, the gain ($\alpha$) of the amplifier multiplied by the attenuation ($\beta$) of the feedback network must be equal to or greater than one ($\alpha\beta \geq 1$).

For values of resistor 30 in the range of 10 meghoms or more, and with $V_{DD} = 10$ volts, a 1 volt swing around the bias point (5 volts D.C.) produces approximately a full 10-volt output swing. Therefore, the gain ($\alpha$) of the amplifier for the full swing is about 5. With the gain equal to 5, the attenuation ratio of the feedback network must be equal to or greater than one-fifth of 0.2.

The operation of the circuit is best understood by assuming, for example, a small falling signal ($V_{IN}$) applied to the input node 16 of the inverter 2. The inverter has an inherent 180° phase shift between its input and output nodes and produces, in response to $V_{IN}$, a signal $V_{18}$ at its output node 18. The signal $V_{18}$ is a rising waveform of amplitude $\alpha V_{IN}$ which is inverted, that is, phase shifted by 180°, with respect to the input signal $V_{IN}$. The output of the inverter is then applied to the feedback circuit 4 which attenuates the signal by a factor $\beta$ and phase shifts it an additional 180°. The output of the feedback network is then fed-back to the input node 16 of amplifier 2. The amplitude of the signal fed-back to the input node is equal to ($\alpha$) ($\beta$)$V_{IN}$ and is in phase with the exciting signal $V_{IN}$. This assumes that the total phase shift around the loop—the phase shift of the amplifier plus that of the feedback network—is equal to 360°.

If the product of $\alpha\beta$ is equal to 1, then the signal fed-back to the input node is equal to the exciting signal and the system is such that oscillations once initiated will be sustained. If the product of $\alpha\beta$ is greater than one, the feedback signal will be greater than the exciting signal and the circuit is such that oscillations always will be initiated. The circuit parameters are, therefore, normally selected so that $\alpha\beta$ is greater than 1.

The output impedance of the amplifying section is predominantly resistive and may be represented by a resistance $R_o$. Resistance $R_o$ in series with resistor $R_3$ determines the input resistance to the feedback network. Variations in $R_o$ cause a change in the phase shift around the loop. Changes in the phase shift are primary sources of error in the frequency of oscillation.

For example, with $R_1$ and $R_2$ short circuited (i.e., the source shorted to the substrate) and with $V_{DD}$ varied from +3 volts to +4.5 volts, the output impedance of a typical complementary inverter was found to change from 5.6 kilohms to 2.01 kilohms and the frequency was found to vary from 262,095.9 HZ to 262,099.5 HZ. The frequency thus changed by approximately 13.6 parts per million (PPM) and the output impedance changed by 64 percent.

Reverse biasing the sources with respect to the substrates by means of resistors $R_1$ and $R_2$, as more fully explained below, minimizes the changes in output impedance as a function of power supply variations and temperature changes. First, the source resistors $R_1$ and $R_2$ provide degenerative feedback to the amplifying stage. Secondly, connecting the sources to the substrate through the resistors $R_1$ and $R_2$ introduces an effect, known as the substrate bias effect, into the operation of the transistors. The degenerative feedback and the effect of substrate bias combine to render the output impedance of the amplifier (the impedance looking back into node 18) more constant.

For a given $+V_{DD}$ applied to terminal 20, a D.C. bias of approximately $(+V_{DD}/2)$ is developed at the gates of the transistors causing a quiescent direct current (D.C.) of $I_1$ to flow through the current path comprising resistor $R_1$ the source-drain paths of transistors 12 and 14 and resistor $R_2$. The potential at the source of transistor 12 is lower than the potential at the substrate 13 due to the voltage drop across resistor $R_1$ $(I_1 \times R_1)$. Also, the potential at the source of transistor 14 is more positive than the potential at the substrate 15 due to the voltage drop across resistor $R_2$ $(I_1 \times R_2)$. Since transistor 12 is a P-type transistor the source-to-substrate region will be reverse biased by the $I_1 \times R_1$ drop (the substrate is more positive than the source) and since transistor 14 is an N-type transistor the source-to-substrate region will also be reverse biased by the $I_1 \times R_2$ drop (the source is more positive than the substrate). Now, a reverse bias between the source and substrate increases the impedance between the source and drain since it makes conduction therebetween more difficult.

Assume now that the $+V_{DD}$ potential is increased by an increment $\Delta V$. This causes the D.C. bias and the corresponding gate potential to increase by approximately $(\Delta V/2)$. As a result, there is an increase in the gate-to-source potential of both P-type transistor 12 and N-type transistor 14. This tends to decrease the source-to-drain impedance of these transistors causing more current to flow in the source-drain paths. An increase current $(I_1 + \Delta I)$ can now flow in the conduction path comprising resistors $R_1$, $R_2$ and the source-drain paths of transistors 12 and 14.

However, the increased current $(\Delta I)$ increases the reverse bias between the sources of transistors 12 and 14 and their respective substrates. For, while the substrates 13 and 15 remain at points of fixed potential $(+V_{DD} + \Delta V$, and ground, respectively) the potential at the source of transistor 12 is decreased with respect to its substrate due to the increased current and the potential at the source of transistor 14 is increased with respect to its substrate due to the increased current. However, increasing the reverse bias between the source and the substrate increases the source-drain impedance which tends to decrease the current flow thereby offsetting the decrease in the output impedance due to the incremental increase in the operating potential.

Similarly, a decrease in the operating potential causes an increase in the output impedance which results in less current flow in the source-drain path. A decrease in current causes the source-to-substrate reverse bias to decrease which in turn lowers the source-to-drain impedance. Thus, in general, the substrate bias effect acts in a direction to minimize changes in the output impedance.

Measurements taken of the output impedance of a typical complementary amplifying stage for various values of source resistance at different values of power supply voltage are set forth in Table I below:

TABLE I

| $R_1 = R_2$ | $V_{DD} = 3V$ | $V_{DD} = 4.5V$ | Change in $R_o$ and frequency |
|---|---|---|---|
| 0 ohms | $R_o$=5.6 Kohms | $R_o$=2.01 Kohms | $\Delta R_o$=64% |
| | $f$=262,095.9 Hz | $f$=262,099.5 Hz | $\Delta f$=13.6ppm |
| 5.1 Kohms | $R_o$=26.4 Kohms | $R_o$=18.2 Kohms | $\Delta R_o$=31% |
| | $f$=262,091.1 Hz | $f$=262,092.3 Hz | $\Delta$f=4.6 ppm |
| 10 Kohms | $R_o$=42.5 Kohms | $R_o$=32.6 Kohms | $\Delta R_o$=23% |
| | $f$=262,090.2 Hz | $f$=262,090.5 Hz | $\Delta$f=1.15 ppm |

An examination of the table shows that the output impedance varied by 23 percent and the frequency by 1.15 part per millions with resistors $R_1$ and $R_2$ equal to 10K. This compares to a $\Delta R_o$ of 64 percent and a $\Delta f$ of 13.6 PPM when $R_1$ and $R_2$ are zero.

The addition of the resistors between the sources and the substrate thus minimize changes in the output impedance and results in greater frequency stability. In addition, the resistors decrease the power drain.

It has also been observed experimentally that the addition of resistors $R_1$ and $R_2$ in the source legs of the transistors minimize the effect of temperature on the output impedance. Thus, temperature compensation is achieved by connecting impedance means between the source and the substrate of the transistors.

Figure 2:
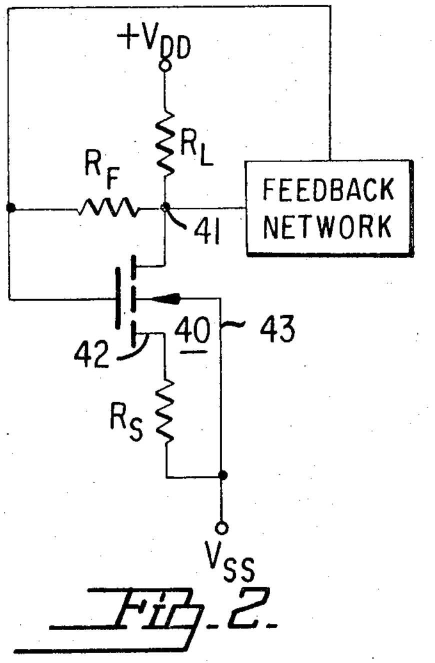
FIG. 2 is a schematic diagram of another oscillator circuit embodying the invention.

In the circuit of FIG. 2 a single N-type transistor 40 is shown having its drain 41 connected through resistor $R_L$ to a point of $+V_{DD}$ potential and its source 42 returned through resistor $R_S$ to a point of operating potential $V_{SS}$ to which the substrate 42 is also connected. The transistor is direct current biased by means of resistor $R_F$ connected between the gate and drain. The resistor $R_F$ sets the output voltage equal to approximately one-half $V_{DD}$ which is in the high gain region of the amplifier transfer characteristic. A feedback network 4 which may be of the same type as shown in FIG. 1 is connected between the drain and the gate. For oscillation to take place the phase shift through the feedback network must be approximately 180°, and the product of the gain due to the inverter multiplied by the attenuation of the feedback network must be equal to or greater than 1. This circuit operates in an analogous fashion to the circuit of FIG. 1 except that the P-type device has been replaced by a resistor $R_L$. Thus, a single transistor properly biased and having a properly designed feedback network can be used as a stable oscillator.

It should be evident that a P-type device could be used instead of the N-type device with corresponding changes in the polarity of the power supply.

In the circuit of FIG. 1, the minimum starting voltage must be equal to or greater than the sum of the threshold voltages of the N-type transistor 14 and the P-type transistor 12. In those applications where the operating potential has a lower value than the sum of the threshold voltages either the circuit shown in FIG. 2 or the biasing scheme as shown in FIG. 3 may be used.

Figure 3:
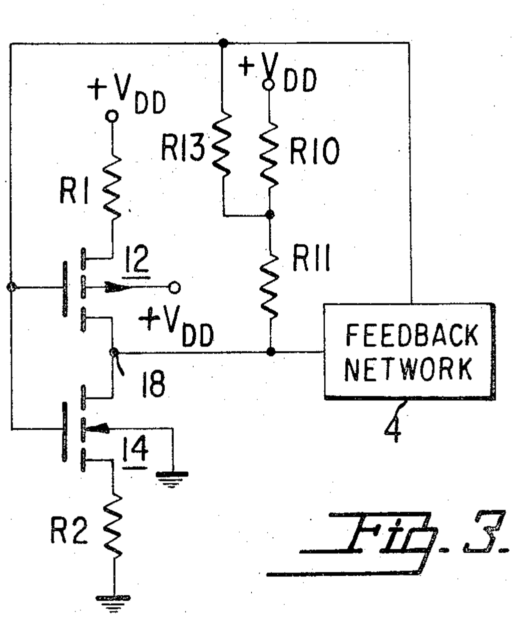
FIG. 3 is a schematic diagram of still another circuit embodying the invention.

Referring to FIG. 3, a voltage divider network comprising resistors $R_{10}$ and $R_{11}$ is connected in series between $+V_{DD}$ terminal and node 18. A resistor $R_{13}$ is connected at one end at the junction of resistors $R_{10}$ and $R_{11}$ and at the other end to the gates of the complementary pair of transistors 12 and 14. Transistors 12 and 14 are connected as before with a feedback network connected between output node 18 and the gates of the inverter.

This circuit can be made to oscillate so long as $+V_{DD}$ is greater than the threshold voltage of transistor 14. The ratio of $R_{10}$ and $R_{11}$ is a function of this threshold voltage. The particular ratio is selected such that the amplifier is biased in its high gain region.

With transistor 14 biased into conduction the circuit is self oscillating. A signal which is applied to the feedback network in turn produces a signal to the gates of sufficient amplitude and of the correct phase to ensure oscillation at the desired frequency.

What is claimed is:

1. The combination comprising:

first and second insulated-gate field-effect transistors of first and second conductivity type, respectively, each transistor having a substrate and source and drain regions defining a conduction channel in their respective substrates, and each transistor also having a gate electrode for controlling the conductivity of its channel;

first and second terminals for a source of operating potential;

an output node connected to the drains of said transistors;

an input node connected to the gates of said transistors;

relatively low impedance connections between the substrate of said first transistor and said first terminal and the substrate of said second transistor and said second terminal;

first substantial direct current impedance means connected between the source electrode of said first transistor and said first terminal and second substantial direct current impedance means connected between the source electrode of said second transistor and said second terminal, for causing the source electrodes of said first and second transistors to be increasingly reversed biased with respect to their substrates with increasing conduction in the source-drain path of said transistors; and approximately an 180° phase-shift feedback network having input and output terminals, said input terminal being connected to said output node, and said output terminal being connected to said input node.

2. The combination as claimed in claim 1 further including impedance means of substantial value connected between said input and output nodes for establishing the direct current operating level of said transistors.

3. The combination as claimed in claim 2 wherein said impedance means includes a resistive network connected between said output node and one of said first and second terminals and a biasing resistor connected between the gates of said transistors and a point on said resistive network for applying a greater portion of the operating potential to one than to the other of said first and second transistors.

4. An oscillator comprising:

first and second insulated-gate field-effect transistors of first and second conductivity type, respectively, each transistor having a substrate electrode, source and drain regions defining a conduction channel therebetween; and a gate electrode for controlling the conductivity of its channel; each of said transistors having a threshold voltage defined as the voltage which it is necessary to apply between the gate and source of the transistor to permit conduction through the conduction channel of the transistor;

first and second terminals for a source of operating potential;

a network having an input terminal and an output terminal, said network being of the type which phase shifts by approximately 180° signals applied to its input terminal;

means connecting the drains of said transistors to said input terminal;

means connecting the gates of said transistors to said output terminal;

means connecting the substrate of said first transistor to said first terminal;

means connecting the substrate of said second transistor to said second terminal;

means connecting the source of said first transistor to said first terminal;

means connecting the source of said second transistor to said second terminal; and a bias network for establishing the quiescent conduction levels of said transistors comprising a resistive network connected between one of said first and second terminals and the drains of said transistors and a biasing resistor connected at one end to the gates of said transistor and at the other end at a point on said resistive network.

5. The combination as claimed in claim 4 wherein the threshold voltage of one of said transistors is greater than the threshold voltage of the other, and wherein the amplitude of the potential applied between said first and second terminals is less than the sum of the threshold voltages of said transistors.

6. The combination as claimed in claim 5 wherein that one of the two transistors having the greater threshold voltage is more heavily forward biased than the other.

7. The combination as claimed in claim 5 wherein said means connecting the source of said first transistor to said first terminal is an impedance of substantially larger value than the impedance of the means connecting the substrate of said transistor to said first terminal and wherein said means connecting the source electrode of said second transistor to said second terminal is an impedance of substantially larger value than the means connecting the substrate of said second transistor to said second terminal.

* * * * *